US011085128B2

(12) United States Patent
Porrini (10) Patent No.: US 11,085,128 B2
(45) Date of Patent: Aug. 10, 2021

(54) DOPANT CONCENTRATION CONTROL IN SILICON MELT TO ENHANCE THE INGOT QUALITY (71) Applicant: GlobalWafers Co., Ltd., Hsinchu (TW)

(72) Inventor: Maria Porrini, Merano (IT)

(73) Assignee: GlobalWafers Co., Ltd., Hsinchu (TW)

(*) Notice: Subject to any disclaimer, the term of this patent is extended or adjusted under 35 U.S.C. 154(b) by 73 days.

(21) Appl. No.: 16/565,695

(22) Filed: Sep. 10, 2019

(65) Prior Publication Data

US 2020/0115818 A1   Apr. 16, 2020

Related U.S. Application Data (60) Provisional application No. 62/744,672, filed on Oct. 12, 2018.

(51) Int. Cl.
| C30B 15/04 | (2006.01) |
| C30B 15/00 | (2006.01) |
| C30B 15/10 | (2006.01) |
| C30B 15/14 | (2006.01) |
| C30B 15/22 | (2006.01) |
| C30B 29/06 | (2006.01) |
| H01L 31/0288 | (2006.01) |
| H01L 31/18 | (2006.01) |

(52) U.S. Cl.
CPC ............ *C30B 15/04* (2013.01); *C30B 15/002* (2013.01); *C30B 15/10* (2013.01); *C30B 15/14* (2013.01); *C30B 15/22* (2013.01); *C30B 29/06* (2013.01); *H01L 31/0288* (2013.01); *H01L 31/182* (2013.01)

(58) Field of Classification Search
CPC ....... C30B 15/00; C30B 15/02; C30B 15/002; C30B 15/04
See application file for complete search history.

(56) References Cited

U.S. PATENT DOCUMENTS

| 8,317,919 B2 | 11/2012 | Bender |
| 9,051,659 B2 | 6/2015 | DeLuca et al. |
| 2010/0089309 A1* | 4/2010 | Soeta ...................... C30B 29/06 117/35 |
| 2010/0175612 A1 | 7/2010 | Narushima et al. |
| 2011/0030793 A1 | 2/2011 | Kraiem et al. |

(Continued)

FOREIGN PATENT DOCUMENTS

| CN | 102260900 B | 11/2013 |
| CN | 105887194 A | 8/2016 |

(Continued)

OTHER PUBLICATIONS

Bagai, R. K. et al.; Growth of Dislocation-Free Bulk Silicon Crystals; Prog. Crystal Growth Charact; 1983; pp. 25-46; vol. No. 6; Great Britain.

(Continued)

*Primary Examiner* — Robert M Kunemund
(74) *Attorney, Agent, or Firm* — Armstrong Teasdale LLP (57) ABSTRACT

Methods for producing single crystal silicon ingots in which the dopant concentration in the silicon melt is controlled are disclosed. The control of the dopant concentration enhances ingot quality by the reduction or elimination of dislocations in the neck, crown, and main body portions of the single crystal silicon ingot.

30 Claims, 2 Drawing Sheets (56) References Cited

U.S. PATENT DOCUMENTS

| | | |
|---|---|---|
| 2012/0056135 A1 | 3/2012 | DeLuca et al. |
| 2012/0301386 A1 | 11/2012 | Johnson et al. |
| 2013/0093058 A1 | 4/2013 | Nakai |
| 2015/0333193 A1 | 11/2015 | Appel et al. |

FOREIGN PATENT DOCUMENTS

| | | |
|---|---|---|
| JP | S57118089 A | 7/1982 |
| WO | 2016031164 A1 | 3/2016 |

OTHER PUBLICATIONS

Choiu, Herng-Der; Phosphorus Concentration Limitation in Czrochralski Silicon Crystals; Journal of the Electrochemical Society; Jan. 1, 2000; pp. 345-349; vol. 147; No. 1.

International Search Report and Written Opinion of the International Searching Authority regarding PCT/US2019/050140 dated Nov. 15, 2019; pp. 1-15.

Voronkov, Vladimir et al., Void Properties in Silicon Heavily Doped with Arsenic and Phosphorus, Physica Status Solidi A, vol. 209, No. 10, 2012, pp. 1898-1901.

Dash, William C., Growth of Silicon Crystals Free from Dislocations, Journal of Applied Physics, vol. 30, No. 4, 2959, pp. 459-474 (abstract only).

Wang, J. H., "Resistivity distribution in bulk growth of silicon single crystals," Journal of Crystal Growth 275 (2005), pp. e73-e78.

Wang, J. H., "Resistivity distribution of silicon single crystals using codoping," Journal of Crystal Growth 280 (2005), pp. 408-412.

Wang, J. H., et al., "Control of Axial Resistivity Distribution in Bridgman Silicon Growth," Japanese Journal of Applied Physics, vol. 43, No. 7A (2004), pp. 4079-4081.

Forster, M., et al., "Boron-oxygen defect in Czochralski-silicon co-doped with gallium and boron," Appl. Phys. Lett. 100, 042110 (2012), 8 pgs.

Glunz, S. W., et al., "Comparison of Boron- and Gallium-doped p-Type Czochralski Silicon for Photovoltaic Application," Prog. Photovolt. Res. Appl. 7 (1999), pp. 463-469.

Fourmond, E., et al., "Electrical properties of boron, phosphorus and gallium co-doped silicon," SiliconPV 17-20 (Apr. 2011), 5 pgs.

Chen, P., et al, "Gallium doped Czochralski silicon with phosphorus compensation for photovoltaic application," State Key Lab of Silicon Materials, Zhejiang University, available before Dec. 28, 2016, 9 pgs.

Cuevas, A., et al, "Compensation Engineering for Silicon Solar Cells," Energy Procedia 15 (2012), pp. 67-77.

* cited by examiner

DOPANT CONCENTRATION CONTROL IN SILICON MELT TO ENHANCE THE INGOT QUALITY

CROSS REFERENCE TO RELATED APPLICATION(S)

This application claims the benefit of priority to U.S. provisional application Ser. No. 62/744,672, filed Oct. 12, 2018, the disclosure of which is hereby incorporated by reference as if set forth in its entirety.

FIELD OF THE DISCLOSURE

The field of the disclosure relates to methods for producing single crystal silicon ingots, and more particularly to a method of producing single crystal silicon ingots of enhanced quality by the control of dopant concentration in the silicon melt.

BACKGROUND

Single crystal silicon, which is the starting material for most processes for the fabrication of semiconductor electronic components, is commonly prepared by the Czochralski ("Cz") method. In this method, polycrystalline silicon ("polysilicon") is charged to a crucible and melted, a seed crystal is brought into contact with the molten silicon, and a single crystal is grown by slow extraction. After formation of a neck is complete, the diameter of the crystal is enlarged by, for example, decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter is typically reduced gradually to form a tail end in the form of an end-cone. The end-cone usually is formed by increasing the crystal pull rate and heat supplied to the crucible. When the diameter becomes small enough, the crystal is then separated from the melt.

As crystal growth is initiated, dislocations are generated in the crystal from the thermal shock of contacting the seed crystal with the melt. These dislocations are propagated throughout the growing crystal and multiplied unless they are eliminated in the neck portion between the seed crystal and the main body of the crystal.

Conventional methods for eliminating dislocations within a silicon single crystal include the so-called "dash neck method" which involves growing a neck having a small diameter (e.g., 2 to 4 mm) at a high crystal pull rate (e.g., as high as 6 mm/min) to completely eliminate dislocations before initiating growth of the main body of crystal. Generally, dislocations can be eliminated in these small diameter necks after approximately 100 to about 125 mm of the neck has been grown. Once the dislocations have been eliminated, the diameter of the crystal is enlarged to form an outwardly flaring "cone" or "taper" portion. When the desired diameter of the outwardly flaring seed-cone adjacent the neck portion is reached, the cylindrical main body is then grown to have an approximately constant diameter.

While conventional methods for eliminating dislocations are mostly successful, such methods may result in some necks which include dislocations which propagate into the constant diameter portion of the ingot. Such ingots are not suitable for device fabrication and are scrapped at high cost.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method of preparing a single crystal silicon ingot by the Czochralski method. The method comprises contacting a silicon seed crystal with a silicon melt, wherein the silicon melt is contained within a crucible and comprises molten silicon and an n-type dopant; withdrawing the silicon seed crystal from the silicon melt to form a neck portion of the single crystal silicon ingot, the neck portion having a resistivity between 5 milliohm-cm and about 12 milliohm-cm; growing an outwardly flaring seed-cone adjacent the neck portion of the single crystal silicon ingot, the outwardly flaring seed-cone having a resistivity between 5 milliohm-cm and about 12 milliohm-cm; adding an n-type dopant to the melt in a concentration sufficient to lower the resistivity of the main body of the single crystal silicon ingot to a resistivity of less than 4 milliohm-cm; and, growing a main body of the single crystal silicon ingot adjacent the outwardly flaring seed-cone, the main body of the single crystal silicon ingot having a resistivity of less than 4 milliohm-cm.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods for producing a single crystal silicon ingot of enhanced ingot quality. The growth of zero dislocation (ZD) single crystal silicon ingots from highly doped silicon melts according to the Czochralski method presents difficulties. During crystal growth, the outwardly flaring seed-cone or crown may lose structure, particularly for highly doped silicon melts. One frequent reason for the loss of zero dislocation (LZD) in the outwardly flaring seed-cone or crown is the incomplete dislocation elimination during growth of the neck portion. If one dislocation survives, it can reach the solid-liquid interface and start growing with the growing interface.

When the crystal diameter is increased to produce the crown, the thermal stress increases significantly, and the dislocation starts multiplying to relieve the stress by plastic deformation. After some time, the density of dislocations is high enough that the growth lines disappear and the loss of structure becomes apparent. A method to resolve the incomplete dislocation elimination in a silicon crystal during the neck growth from heavily doped silicon melts is therefore needed.

This invention provides a method to maximize the probability that dislocations in one of or all of the neck portion, the outwardly flaring seed-cone adjacent, and the main body of the single crystal silicon ingot may be reduced or eliminated. Obtaining low or zero dislocation growth is by the control of the dopant concentration in the silicon melt during growth of the single crystal silicon ingot. The method prescribes adding a controlled amount of dopant to the melt before starting the neck. The quantity of dopant should be such as to obtain a resistivity at the crystal seed end between 5 milliohm-cm and about 12 milliohm-cm, such as between 5 milliohm-cm and about 8 milliohm-cm. This resistivity corresponds to the dopant concentration range where the vacancy concentration in the crystal, during the neck growth, is the largest, in the case of doping with an n-type dopant, e.g., arsenic-doping. In some embodiments, therefore, the neck portion of the single crystal silicon ingot comprises vacancies as a dominant intrinsic point defect. In some embodiments, the outwardly flaring seed-cone of the single crystal silicon ingot comprises vacancies as a dominant intrinsic point defect. Within the resistivity ranges of between 5 milliohm-cm and about 12 milliohm-cm, such as between 5 milliohm-cm and about 8 milliohm-cm, the dislocations climb to the crystal/melt surface interface, i.e., the edge of the growing ingot, and are eliminated. This method can be applied conveniently to crystal growth methods wherein any target resistivity is achieved by doping during the body phase, such as the Continuous Czochralski method. In this case, in fact, it is possible to start the process with a melt concentration optimized for dislocations elimination in neck and achieve a successful zero dislocation (ZD) crown and start the body. When the body is started, it is possible to reach much lower resistivities, for example, less than about 4 milliohm-cm, less than 2 about milliohm-cm, less than about 1.7 milliohm-cm or even about 1.6 milliohm-cm and less, without incurring in loss of structure (Loss of zero dislocation, or LZD), by doping during growth.

Figure 1:
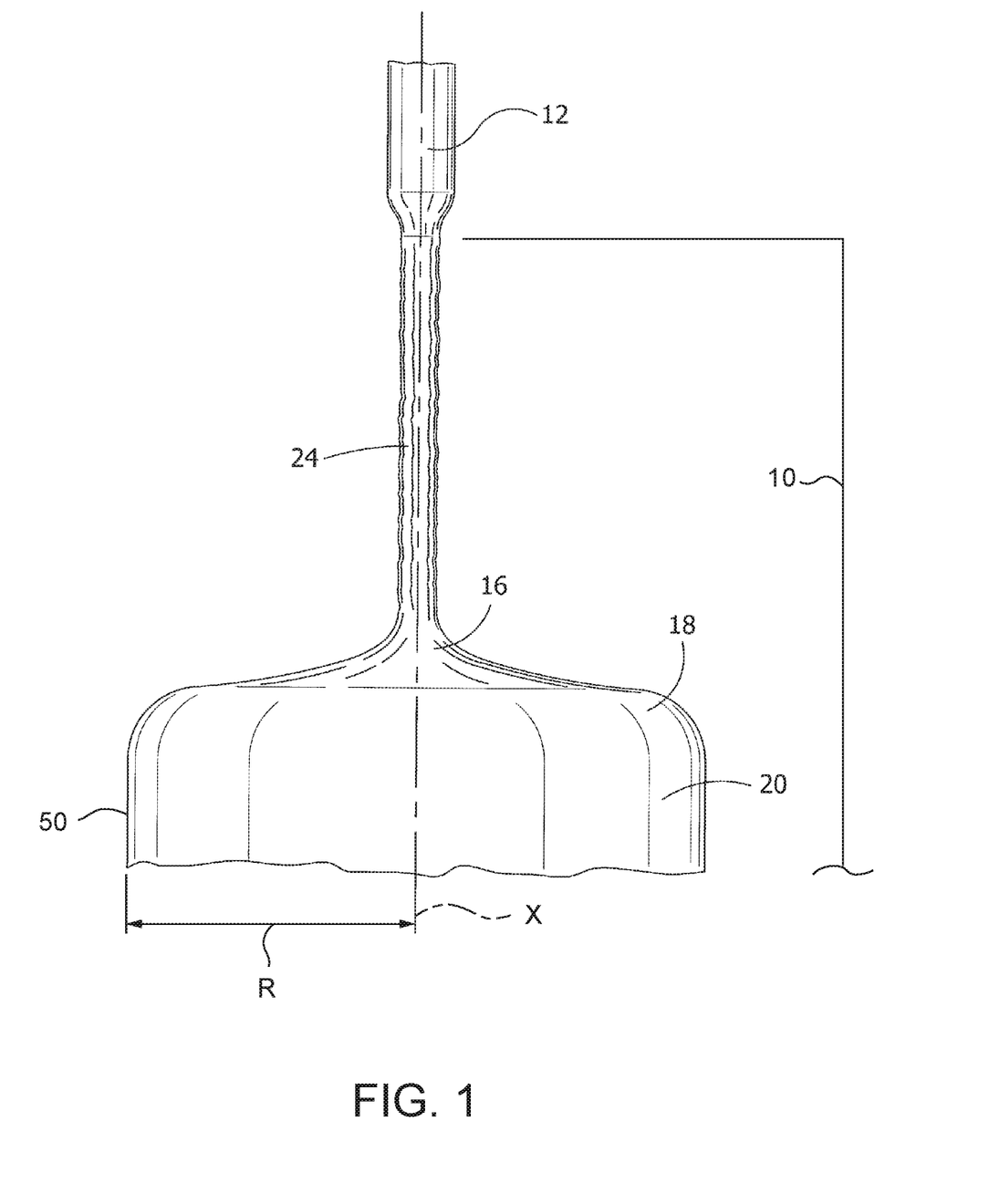
FIG. 1 is a partial front view of a single crystal silicon ingot grown by the Czochralski method.
Figure 2:
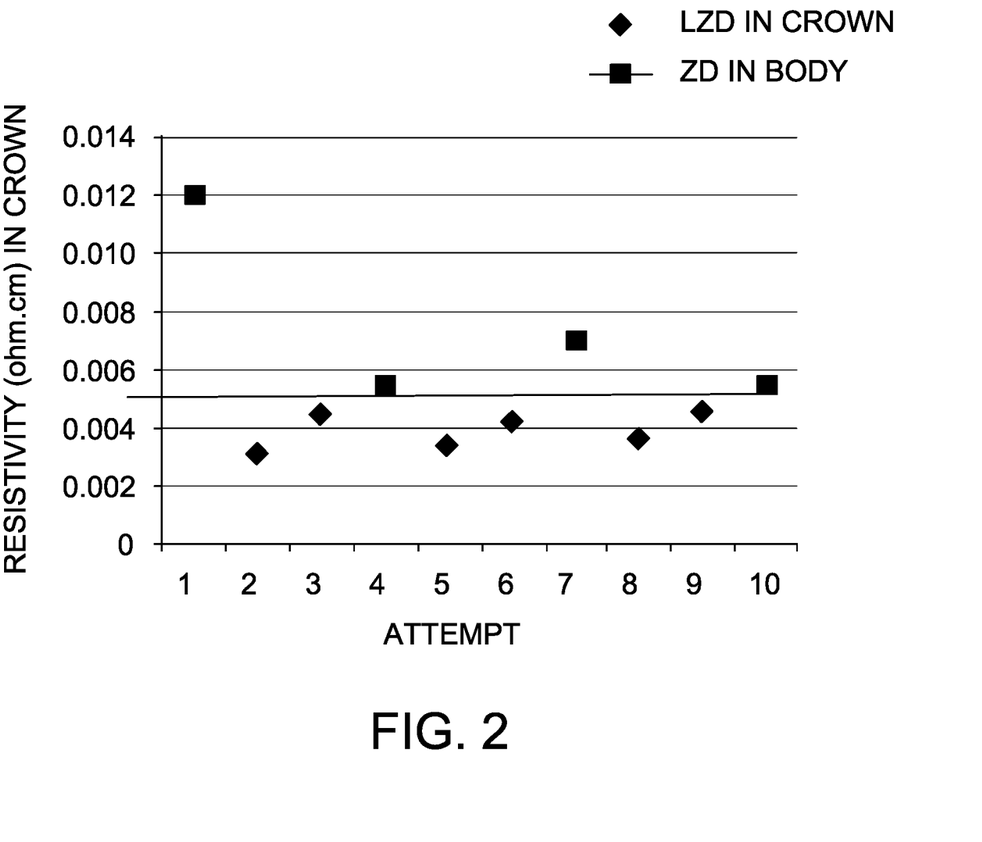
FIG. 2 is a graph depicting zero dislocation or loss of zero dislocation growth of single crystal silicon ingot grown by the Czochralski method according to resistivity of the neck and outwardly flaring seed-cone portions of the ingot.

A single crystal silicon ingot 10 produced in accordance with embodiments of the present disclosure and, generally, the Czochralski method is shown in FIG. 1. The ingot 10 includes a portion of the seed crystal 12 originally contacted with the silicon melt, a neck portion 24 adjacent the seed crystal 12, an outwardly flaring seed-cone portion 16, a shoulder 18, and a constant diameter main body 20. The neck 24 is attached to the seed crystal 12 that was contacted with the melt and withdrawn to form the ingot 10. The neck 24 terminates once the cone portion 16 of the ingot begins to form.

Generally, the melt from which the ingot 10 is drawn is formed by loading polycrystalline silicon into a crucible to form a silicon charge. A variety of sources of polycrystalline silicon may be used including, for example, granular polycrystalline silicon produced by thermal decomposition of silane or a halosilane in a fluidized bed reactor or polycrystalline silicon produced in a Siemens reactor. The solid polysilicon added to the crucible is typically granular polysilicon, although chunk poly silicon may be used, and it is fed into the crucible using a polysilicon feeder that is optimized for use with granular polysilicon. Chunk polysilicon typically has a size of between 3 and 45 millimeters (e.g., the largest dimension), and granular polysilicon typically has a size between 400 and 1400 microns. Granular polysilicon has several advantages including providing for easy and precise control of the feed rate due to the smaller size. However, the cost of granular polysilicon is typically higher than that of chunk polysilicon due to the chemical vapor deposition process or other manufacturing methods used in its production. Chunk polysilicon has the advantage of being cheaper and being capable of a higher feed rate given its larger size. The location of the heating units, cooling jacket, and operation of the power control are adjusted to accommodate the polycrystalline silicon feeder. The mass of the loaded silicon charge, particularly for a batch process, may vary from at least about 25 kg to about 2000 kg depending upon the size of the single crystal silicon ingot, such as at least about 50 kg to about 2000 kg, or at least about 50 kg to about 1800 kg, such as between about 50 kg and about 1500 kg.

Once polycrystalline silicon is added to the crucible to form a charge, the charge is heated to a temperature above about the melting temperature of silicon (e.g., about 1412° C.) to melt the charge, and thereby form a silicon melt comprising molten silicon. In some embodiments, the crucible comprising the silicon melt is heated to a temperature of at least about 1425° C., at least about 1450° C. or even at least about 1500° C.

In some embodiments, the process of the present invention is utilized in n-type single crystal silicon ingots. As used herein, the term "n-type" refers to silicon containing an element from Group 5 of the Periodic Table such as arsenic, phosphorus, antimony, or combinations thereof. In some embodiments, the silicon comprises arsenic as the n-type dopant. N-type ingots are obtained by adding sources of n-type dopants to the silicon melt during Czochralski growth, e.g., solid elemental sources of arsenic, phosphorus, and/or antimony of acceptable purity. In some embodiments, the concentration of n-type dopant added to the silicon melt is between about 200 grams of n-type dopant/60 kilograms of silicon and about 400 grams of n-type dopant/60 kilograms of silicon, such as about 300 grams of n-type dopant/60 kilograms of silicon. Doping efficiency is generally less than 100%, due to such factors as the incomplete incorporation of the dopant, the segregation coefficient of the dopant between the silicon melt and the solidified silicon in the ingot, and evaporation of the dopant from the melt. Accordingly, the amount of n-type dopant added to the silicon melt is generally about twice that which is effectively incorporated into the melt itself.

Once the charge is liquefied to form a silicon melt comprising molten silicon and the n-type dopant, the silicon seed crystal (a portion of which is depicted as 12 in FIG. 1) is lowered to contact the melt. The silicon seed crystal is then withdrawn from the melt with silicon being attached thereto (i.e., with a neck 24 being formed) thereby forming a melt-solid interface near or at the surface of the melt. In some embodiments, the silicon seed crystal is withdrawn at a pull rate between about 1.5 mm/minute and about 6 mm/minute, such as between about 3 mm/minute and about 5 mm/minute. In some embodiments, the silicon seed crystal is rotated at a rate of between about 5 rpm and about 30 rpm, or between about 5 rpm and about 20 rpm, or between about 8 rpm and about 20 rpm, or between about 10 rpm and about 20 rpm. In some embodiments, the silicon seed crystal is rotated at a rate of between about 8 rpm and about 15 rpm, such as about 11 rpm. In some embodiments, the crucible is rotated at a rate between about 0.5 rpm and about 10 rpm, or between about 1 rpm and about 10 rpm, or between about 4 rpm and about 10 rpm, or between about 5 rpm and about 10 rpm, such as about 8 rpm. In some embodiments, the seed crystal is rotated at a faster rate than the crucible. In some embodiments, the seed crystal is rotated at a rate that is at least 1 rpm higher than the rotation rate of the crucible, such as at least about 3 rpm higher, or at least about 5 rpm higher. Conventionally, the crystal rotation rate is higher than the crucible rotation rate, to favor a good radial uniformity of the dopant concentration in the crystal. In some embodiments, the silicon seed crystal and the crucible are rotated in opposite directions, i.e., counter-rotation.

In general, the neck portion has a length between about 10 millimeters and about 700 millimeters, between about 30 millimeters and about 700 millimeters, between about 100 millimeters and about 700 millimeters, between about 200 millimeters and about 700 millimeters, or between about 300 millimeters and about 700 millimeters. In some embodiments, the neck portion has a length between about 10 millimeters and about 100 millimeters, such as between about 20 and about 50 millimeters. In some embodiments, the neck portion has a length between about 350 millimeters and about 550 millimeters. In some embodiments, the neck portion has a length between about 450 millimeters and about 550 millimeters. However, the length of the neck portion may vary outside these ranges. In some embodiments, the neck portion has a diameter between about 1 mm and about 10 mm, between about 2.5 mm and about 6.5 mm, such as between about 3 mm and about 6 mm. The lower neck diameter limit is determined by the need to have enough mechanical strength to sustain the crystal weight as the main body of the crystal ingot grows in size. The higher limit is determined by the fact that the dislocation elimination becomes more difficult with increasing diameter, i.e., longer distance to the surface that the dislocation must travel plus the risk of dislocation multiplication driven by the higher thermal stress induced by the higher thermal gradient between crystal center and crystal surface if the diameter is larger. In some embodiments, the neck portion formed during the growth of an n-type single crystal silicon ingot has a resistivity between 5 milliohm-cm and about 12 milliohm-cm, such as between 5 milliohm-cm and about 8 milliohm-cm. Suitable concentrations of incorporated n-type dopant, particularly arsenic, into the neck portion to achieve these resistivities may be between about $3.5 \times 10^{18}$ atoms/cm$^3$ and about $1.3 \times 10^{19}$ atoms/cm$^3$, such as between about $4 \times 10^{18}$ atoms/cm$^3$ and $1 \times 10^{19}$ atoms/cm$^3$.

After formation of the neck, the outwardly flaring seed-cone portion 16 adjacent the neck 24 is grown. In general, the pull rate is decreased from the neck portion pull rate to a rate suitable for growing the outwardly flaring seed-cone portion 16. For example, the seed-cone pull rate during growth of the outwardly flaring seed-cone 16 is between about 0.5 mm/min and about 2.0 mm/min, such as about 1.0 mm/min. In some embodiments, the outwardly flaring seed-cone 16 has a length between about 100 millimeters and about 400 millimeters, such as between about 150 millimeters and about 250 millimeters. The length of the outwardly flaring seed-cone 16 may vary outside these ranges. In some embodiments, the outwardly flaring seed-cone 16 is grown to a terminal diameter of about 150 mm, at least about 150 millimeters, about 200 mm, at least about 200 millimeters, about 300 mm, at least about 300 mm, about 450 mm, or even at least about 450 mm. The terminal diameter of the outwardly flaring seed-cone 16 is generally equivalent to the diameter of the constant diameter of the main body of the single crystal silicon ingot. In some embodiments, the outwardly flaring seed-cone adjacent the neck portion formed during the growth of an n-type single crystal silicon ingot has a resistivity between 5 milliohm-cm and about 12 milliohm-cm, such as between 5 milliohm-cm and about 8 milliohm-cm. Suitable concentrations of incorporated n-type dopant, particularly arsenic, into the outwardly flaring seed-cone to achieve these resistivities may be between about $3.5 \times 10^{18}$ atoms/cm$^3$ and about $1.3 \times 10^{19}$ atoms/cm$^3$, such as between about $4 \times 10^{18}$ atoms/cm$^3$ and $1 \times 10^{19}$ atoms/cm$^3$.

In some embodiments, a concentration of the n-type dopant in the neck portion and the outwardly flaring seed-cone and the main body exceeds a concentration of the p-type dopant, such as boron, aluminum, or gallium, in the neck portion and the outwardly flaring seed-cone. The n-type dopant is the predominant dopant in order to achieve the desired resistivity and the vacancies as the dominant intrinsic point defect in the neck and outwardly flaring seed-cone. Preferably, the concentration of n-type dopant greatly exceeds the concentration of p-type dopant. P-type dopant concentration, whether added intentionally to the silicon melt and growing crystal or as a contaminant, is preferably below about $1 \times 10^{16}$ atoms/cm$^3$, preferably less than $1 \times 10^{15}$ atoms/cm$^3$, and even more preferably less than $1 \times 10^{14}$ atoms/cm$^3$.

After formation of the neck 24 and the outwardly flaring seed-cone 16 adjacent the neck portion 24, the main ingot body 20 having a constant diameter adjacent the cone portion 16 is then grown. The constant diameter portion of the main body 20 has a circumferential edge 50, a central axis X that is parallel to the circumferential edge and a radius R that extends from the central axis to the circumferential edge. The central axis X also passes through the cone portion 16 and neck 24. The diameter of the main ingot body 20 may vary and, in some embodiments, the diameter may be about 150 mm, about 200 mm, about 300 mm, greater than about 300 mm, about 450 mm or even greater than about 450 mm. In some embodiments, the main body of the single crystal silicon ingot is eventually grown to be at least about 1000 millimeters long, such as at least 1100 millimeters long, such as at least 1200 millimeters long, such as at least 1400 millimeters long, such as at least 1500 millimeters long, such as at least 1700 millimeters long, or at least 1900 millimeters long, or at least 2000 millimeters long, or at least 2200 millimeters, or at least about 3000 millimeters long, or at least about 4000 millimeters long.

According to the method of the present invention, the resistivity of the main body of the single crystal silicon ingot may be lower than the resistivity of the neck portion and/or the outwardly flaring seed-cone adjacent the neck portion. This may be achieved by adding additional n-type dopant, e.g., arsenic, to the silicon melt after the outwardly flaring seed-cone adjacent the neck portion is formed. In some embodiments, the main body of the single crystal silicon ingot is an n-type ingot, e.g., doped with arsenic, having a resistivity of less than 4 milliohm-cm, such as less than 2 milliohm-cm, less than 1.7 milliohm-cm, or even less than about 1.6 milliohm-cm. At these resistivities, the main body of the ingot may shift from vacancy dominant material, as in the neck and outwardly flaring seed-cone, to interstitials as the dominant intrinsic point defect. However, once the dislocations are removed in neck and crown, the body phase does not need to be vacancy-rich to keep the dislocation-free character of the growing single crystal silicon ingot.

Additionally, according to the process of the present invention, a magnetic field may be applied to the crucible comprising the silicon melt. Either cusp or horizontal magnet field can be applied to set the appropriate crystal/melt interface, i.e., the shape and height of the meniscus. The magnetic field is used to fix a desire crystal/melt interface shape and height primarily, and control of the oxygen content, Oi, is a subordinate purpose.

Control of the melt flow and the shape of the melt/solid interface and therefore the quality of the ingot may be enhanced by the application of a magnetic field to the silicon melt during growth of the main body of the single crystal silicon ingot. In some embodiments, the applied magnetic field maintains a substantially constant melt/solid interface profile during at least about 70% of the growth of the main body of the single crystal silicon ingot, or between about 70% and about 90% of the growth of the main body of the single crystal silicon ingot. The magnetic field applies electromagnetic force, which affects the silicon melt flow, so the heat transfer in the melt is affected. It changes the profile of crystal/melt interface and the temperature of growing crystal, which are the key control parameter of perfect silicon.

The magnetic field impacts the oxygen content and uniformity in the ingot. The source of oxygen is the ingot is from dissolution of the quartz crucible wall, evaporation SiOx (g) at the melt free surface (controlled by melt flow kinetics) and incorporation into growing crystal front. The magnet field impacts the convective melt flow during growth which can impact Oxygen evaporation and incorporation. The variation of oxygen incorporation into the single crystal silicon ingot by time increment is controlled by the diffusion and convection of oxygen in the melt according to the following equation:

$$\frac{\partial C}{\partial t} = \nabla C = v\rho + \text{SOURCE}.$$

C is the concentration of oxygen is the solidifying silicon, t is time, v is the convection velocity (melt flow velocity), rho, $\rho$, is the density of silicon melt, $\nabla$ is the gradient (d/dx). The applied magnetic field affects the melt velocity (v) and the gradient of oxygen concentration in the melt (dC/dx=$\nabla$C). Since magnetic field results in a steady state melt flow, the incorporating of oxygen, Oi, into the ingot is time constant, which enhances radial and axial oxygen concentration uniformity. The SOURCE term is derived from two parameters, the dissolution of quartz (SiO$_2$) crucible which is the generation of oxygen (Si(l)+SiO2(s)→SiOx(g)), and the evaporation which is the removal (disappearance) of oxygen (SiOx(g)) from melt. In a batch Cz process, this SOURCE term is not constant. Instead, it depends upon the crystal length since the melt mass decreases as the crystal is grown. When the ingot has grown a substantial portion of its body length, the remaining melt volume is low, so that that amount of silicon melt in contact with the crucible is decreased, which therefore leads to lower concentrations of oxygen incorporated from the crucible into the melt. Therefore, the oxygen incorporated into solidifying silicon crystal is decreased, if other terms (diffusion, convection, evaporation) are constant. The melt free surface (contact surface between melt and gas) area affects the evaporation rate of SiOx(g). A small melt mass in a batch Cz process has relatively smaller surface area due to shape of crucible as shown in FIG. 1C. Less evaporation of SiOx(g) means more oxygen incorporation into the solidifying silicon crystal. According to the method of the present invention, the melt mass is maintained as constant since polysilicon is added as the crystal ingot grows. Accordingly, all source terms (generation of Oxygen by SiO$_2$ crucible dissolution into melt, and evaporation of SiOx(g) gas through melt free surface) are constant. Therefore, the diffusion and convection terms affect the oxygen of solidifying silicon crystal. The applied magnetic field makes melt flow more stable (i.e., melt flow is constant like as time independent steady condition), so incorporating Oxygen is uniform and stable in the axial and radial directions during growth of the entire length of the ingot. In some embodiments, interstitial oxygen may be incorporated into the ingot in a concentration between about 4 PPMA and about 18 PPMA. In some embodiments, interstitial oxygen may be incorporated into the ingot in a concentration between about 10 PPMA and about 35 PPMA. In some embodiments, the ingot comprises oxygen in a concentration of no greater than about 15 PPMA, or no greater than about 10 PPMA. Interstitial oxygen may be measured according to SEMI MF 1188-1105.

In some embodiments, a horizontal magnetic field is applied to the silicon melt during growth of the main body of the single crystal silicon ingot. Crystal growth in presence of a horizontal magnetic field is achieved by placing the crucible holding the silicon melt between the poles of a conventional electromagnet. In some embodiments, the horizontal magnetic field may have a magnetic flux density between about 0.2 Tesla and about 0.4 Tesla in the melt area. Magnetic field variation in the melt is less than +/− about 0.03 Tesla in a given strength. Application of a horizontal magnetic field gives rise to Lorentz force along axial direction, in a direction opposite of fluid motion, opposing forces driving melt convection. The convection in the melt is thus suppressed, and the axial temperature gradient in the crystal near the interface increases. The melt-crystal interface then moves upward to the crystal side to accommodate the increased axial temperature gradient in the crystal near the interface and the contribution from the melt convection in the crucible decreases.

In some embodiments, a cusp magnetic field is applied to the silicon melt during growth of the main body of the single crystal silicon ingot. A cusp magnetic field has two controlling parameters, namely the magnetic flux density and magnetic field shape. A cusp magnetic field applies a horizontal (radial) magnetic field component at the nearest surface of the melt combined with a vertical (axial) magnetic field deeper in the melt near the axis of the ingot. The cusp magnetic field is generated using a pair of Helmholtz coil carrying current in opposite direction. As a result, at the position halfway between the two magnetic fields, vertically along the ingot axis, the magnetic fields cancel each other out to make a vertical magnetic field component at or near zero. For example, the cusp magnetic flux density is typically about zero to about 0.2 Tesla in the axial direction. The magnetic flux density in the radial direction is generally higher than the magnetic flux density in the vertical direction. For example, the cusp magnetic flux density is typically between about 0 and about 0.6 T in the radial position, such as between about 0.2 and about 0.5 T, dependent upon the radial position. The radial cusp magnetic field restrains the flow of the melt, to thereby stabilize the melt. In other words, application of a radial cusp magnetic field induces convection at a portion adjacent to the solid-liquid interface at which crystal growth occurs, and suppresses convection at the remaining portions of the melt, to thereby serve as an effective method for realizing uniform oxygen distribution.

Thermal melt convection can be locally and independently controlled by the cusp magnetic field at the melt free surface and at the melt crucible interface at the same time. This enables to control the oxygen concentration in the growing crystal by magnetic flux density only, irrespective of crystal rotation speed. In presence of an axial or a radial magnetic field, control of oxygen concentration is achieved via control of crystal rotation speed. Application of the cusp magnetic field may enable growth on an ingot comprising less oxygen content than an ingot grown without an applied magnetic field, such as no greater than about 15 PPMA, or no greater than about 10 PPMA. Interstitial oxygen may be measured according to SEMI MF 1188-1105.

Upon completion of a first single crystal silicon ingot, the crystal puller may undergo a stabilization period before growth of the second neck to allow the chuck and seed to be sufficiently preheated. Accordingly, in some embodiments, growth of a first single crystal silicon ingot is completed, which is followed by replenishment of the silicon melt by adding silicon and an n-type dopant. The second neck is then put in contact with the replenished silicon melt; and the second silicon seed crystal is withdrawn to form a second neck portion of a second single crystal silicon ingot. In some embodiments, the second neck portion has a resistivity between 5 milliohm-cm and about 12 milliohm-cm, such as between 5 milliohm-cm and about 8 milliohm-cm. Additionally, a second outwardly flaring seed-cone is grown, this seed-cone having a resistivity between 5 milliohm-cm and about 12 milliohm-cm, such as between 5 milliohm-cm and about 8 milliohm-cm. Thereafter, additional n-type dopant is added to the melt to achieve lower resistivity of the main body of the second crystal. Accordingly, the main body of the second single crystal silicon ingot has a resistivity of less than 4 milliohm-cm, such as less than 2 milliohm-cm, less than 1.7 milliohm-cm, or even less than about 1.6 milliohm-cm.

The process may be repeated multiple times to grow additional ingots having these resistivity properties.

According to the method of the present invention, the addition of n-type dopant within the concentrations sufficient to achieve a resistivity between 5 milliohm-cm and about 12 milliohm-cm, such as between 5 milliohm-cm and about 8 milliohm-cm in the neck portion and the outwardly flaring seed-cone adjacent the neck portion promotes a very high vacancy concentration in the growing single crystal silicon ingot. In some embodiments, vacancies are the dominant intrinsic point defect in the neck portion. In some embodiments, vacancies are the dominant intrinsic point defect in the outwardly flaring seed-cone adjacent the neck portion. In some embodiments, vacancies are the dominant intrinsic point defect in the neck portion and in the outwardly flaring seed-cone adjacent the neck portion. Vacancies as the dominant intrinsic point defect favors the elimination of the existing dislocations by climbing towards the crystal surface even without adopting a high pull rate. In lightly doped material, a combination of a high pull rate and a small diameter neck is often adopted. The thin neck is helpful to minimize the thermal stress and the travel distance of the existing dislocations to the crystal surface where they disappear. A high pull rate is useful to incorporate many vacancies and favor the dislocation movement towards the crystal surface. In the case of heavily doped crystals, however, this method is not useful, for two reasons. First, the vacancy concentration becomes a function exclusively of the dopant concentration and does not depend appreciably on the pull rate (or, more precisely, on the V/G ratio between pull rate and axial thermal gradient). Second, a high pull rate favors the onset of constitutional supercooling problems in the case of heavily doped melts, therefore for heavily doped melts the pull rate cannot be chosen in a wide range of values as for lightly doped melts. The present solution allows the selection of a pull rate value optimized to avoid the condition of constitutional supercooling during neck, while controlling the vacancy concentration by means of the dopant concentration. In this way the two problems are decoupled.

The method of the present invention enables the formation of single crystal silicon ingots having reduced or eliminated dislocations. In some embodiments, a slice of the main body of the single crystal silicon ingot comprises less than about 400 dislocations/$cm^2$, such as less than about 100 dislocations/$cm^2$, or less than about 10 dislocations/$cm^2$, or even less than 1 dislocation/$cm^2$. In some embodiments, a slice of the main body of the single crystal silicon ingot is a zero dislocation wafer. Dislocations may be determined by means conventional in the art, such as by removing a slice from the ingot and performed a preferential etch to delineate the dislocations.

EXAMPLES

The processes of the present disclosure are further illustrated by the following Examples. These Examples should not be viewed in a limiting sense.

Multiple single crystal silicon ingots were grown. The ingots were N-type and doped with arsenic. The crystals were grown with a neck diameter of 5.5 mm, and a neck length of 40 mm. The crystal rotation rate was 11 rpm, and the crucible rotation rate was 8 rpm. The melt mass was 60 kg. The resistivity of the neck portions and the crowns were varied to values below and above 5 milliohm-cm. The dislocations in the body portion were then measured. The results are shown in FIG. 4. It can be clearly seen that all attempts with a resistivity less than 4.5 mΩ·cm resulted in crown loss of zero dislocation (LZD) and dislocations in the main body of the ingot, while the attempts with a resistivity greater than 5.5 mΩ·cm were successful in achieving zero dislocation growth in the crown and body of the single crystal silicon ingot.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method of preparing a single crystal silicon ingot by the Czochralski method, the method comprising:
   contacting a silicon seed crystal with a silicon melt, wherein the silicon melt is contained within a crucible and comprises molten silicon and an n-type dopant;
   withdrawing the silicon seed crystal from the silicon melt to form a neck portion of the single crystal silicon ingot, the neck portion having a resistivity between 5 milliohm-cm and about 12 milliohm-cm, wherein the silicon seed crystal is withdrawn at a pull rate between about 3 mm/minute and about 5 mm/minute, further wherein the neck portion of the single crystal silicon ingot comprises vacancies as a dominant interstitial point defect, and further wherein a concentration of the n-type dopant in the neck portion is between about $3.5 \times 10^{18}$ atoms/cm$^3$ and about $1.3 \times 10^{19}$ atoms/cm$^3$;
   growing an outwardly flaring seed-cone adjacent the neck portion of the single crystal silicon ingot, the outwardly flaring seed-cone having a resistivity between 5 milliohm-cm and about 12 milliohm-cm, wherein the outwardly flaring seed-cone of the single crystal silicon ingot comprises vacancies as a dominant interstitial point defect and further wherein a concentration of the n-type dopant in the outwardly flaring seed-cone is between about $3.5 \times 10^{18}$ atoms/cm$^3$ and about $1.3 \times 10^{19}$ atoms/cm$^3$;
   adding an n-type dopant to the melt in a concentration sufficient to lower the resistivity of the main body of the single crystal silicon ingot to a resistivity of less than 4 milliohm-cm; and,
   growing a main body of the single crystal silicon ingot adjacent the outwardly flaring seed-cone, the main body of the single crystal silicon ingot having a resistivity of less than 4 milliohm-cm.

2. The method of claim 1, tither comprising:
   completing growth of the single crystal silicon ingot;
   adding silicon and an n-type dopant to the crucible to form a replenished silicon melt;
   contacting a second silicon seed crystal with the replenished silicon melt comprising molten silicon and added n-type dopant; and
   withdrawing the second silicon seed crystal from the silicon melt to form a second neck portion of a second single crystal silicon ingot, the second neck portion having a resistivity between 5 milliohm-cm and about 12 milliohm-cm.

3. The method of claim 1, wherein the silicon seed crystal is rotated at a rate of between about 8 rpm and about 15 rpm.

4. The method of claim 1, wherein the crucible is rotated at a rate of between about 5 rpm and about 10 rpm.

5. The method of claim 1, wherein the neck portion has a diameter between about 2.5 mm and about 6.5 mm.

6. The method of claim 1, wherein the neck portion has a diameter between about 3 mm and about 6 mm.

7. The method of claim 1, wherein the single crystal silicon ingot is an n-type ingot.

8. The method of claim 7, wherein a concentration of the n-type dopant in the neck portion and the outwardly flaring seed-cone exceeds a concentration of the p-type dopant in the neck portion and the outwardly flaring seed-cone.

9. The method of claim 7, wherein the concentration of the n-type dopant in the neck portion is between about $4 \times 10^{18}$ atoms/cm$^3$ and $1 \times 10^{19}$ atoms/cm$^3$.

10. The method of claim 7, wherein the concentration of the n-type dopant in the outwardly flaiing seed-cone is between about $4 \times 10^{18}$ atoms/cm$^3$ and $1 \times 10^{19}$ atoms/cm$^3$.

11. The method of claim 7, wherein the neck portion has resistivity between 5 milliohm-cm and about 8 milliohm-cm.

12. The method of claim 7, wherein the outwardly flaring seed-cone has resistivity between 5 milliohm-cm and about 8 milliohm-cm.

13. The method of claim 1, wherein the main body of the single crystal silicon ingot has a resistivity of less than about 2 milliohm-cm.

14. The method of claim 1, wherein the main body of the single crystal silicon ingot has a resistivity of less than 1.7 milliohm-cm.

15. The method of claim 1, wherein the main body of the single crystal silicon ingot has a resistivity of less than 1.6 milliohm-cm.

16. The method of claim 1 wherein the n-type dopant is selected from the group consisting of arsenic, phosphorus, antimony, and any combination thereof.

17. The method of claim 1, wherein the n-type dopant is arsenic.

18. The method of claim 1, wherein the concentration of n-type dopant added to the silicon melt is between about 200 grams of n-type dopant/60 kilograms of silicon and about 400 grams of n-type dopant/60 kilograms of silicon.

19. The method of claim 1, wherein the concentration of n-type dopant added to the silicon melt is about 300 grams of n-type dopant/60 kilograms of silicon.

20. The method of claim 1, wherein a slice of the main body of the single crystal silicon ingot comprises less than about 400 dislocations/cm$^2$.

21. The method of claim 1, wherein a slice of the main body of the single crystal silicon ingot comprises less than about 100 dislocations/cm$^2$.

22. The method of claim 1, wherein a slice of the main body of the single crystal silicon ingot comprises less than about 10 dislocations/cm$^2$.

23. The method of claim 1, wherein a slice of the main body of the single crystal silicon ingot comprises less than 1 dislocation/cm$^2$.

24. The method of claim 1, wherein a slice of the main body of the single crystal silicon ingot is a zero dislocation wafer.

25. A single crystal silicon ingot comprising:
   a neck portion of the single crystal silicon ingot, the neck portion having a resistivity between 5 milliohm-cm and about 12 milliohm-cm, wherein the neck portion of the single crystal silicon ingot comprises vacancies as a dominant interstitial point defect and further wherein a concentration of the n-type dopant in the neck portion is between about $3.5 \times 10^{18}$ atoms/cm$^3$ and about $1.3 \times 10^{19}$ atoms/cm$^3$;
   an outwardly flaring seed-cone adjacent the neck portion of the single crystal silicon ingot, the outwardly flaring seed-cone having a resistivity between 5 milliohm-cm and about 12 milliohm-cm, wherein the outwardly flaring seed-cone of the single crystal silicon ingot comprises vacancies as a dominant interstitial point defect and further wherein a concentration of the n-type in the outwardly flaring seed-cone is between about $3.5 \times 10^{18}$ atoms/cm$^3$ and about $1.3 \times 10^{19}$ atoms/cm$^3$; and,
   a main body of the single crystal silicon ingot adjacent the outwardly flaring seed-cone, the main body of the single crystal silicon ingot having a resistivity of less than 4 milliohm-cm.

26. The single crystal silicon ingot of claim 25, wherein a slice of the main body of the single crystal silicon ingot comprises less than about 400 dislocations/cm$^2$.

27. The single crystal silicon ingot of claim 25, wherein a slice of the main body of the single crystal silicon ingot comprises less than about 100 dislocations/cm$^2$.

28. The single crystal silicon ingot of claim 25, wherein a slice of the main body of the single crystal silicon ingot comprises less than about 10 dislocations/cm$^2$.

29. The single crystal silicon ingot of claim 25, wherein a slice of the main body of the single crystal silicon ingot is a zero dislocation wafer.

30. The single crystal silicon ingot of claim 25, wherein a slice of the main body of the single crystal silicon ingot comprises less than 1 dislocation/cm$^2$.

* * * * *

UNITED STATES PATENT AND TRADEMARK OFFICE
CERTIFICATE OF CORRECTION

| | |
|---|---|
| PATENT NO. | : 11,085,128 B2 |
| APPLICATION NO. | : 16/565695 |
| DATED | : August 10, 2021 |
| INVENTOR(S) | : Maria Porrini |

It is certified that error appears in the above-identified patent and that said Letters Patent is hereby corrected as shown below:

In the Claims

In Claim 8, Column 11, Line 60, delete "the p-type dopant" and insert therefor -- p-type dopant --.

In Claim 18, Column 12, Lines 22-23, delete "the concentration of n-type dopant" and insert therefor -- a concentration of the n-type dopant --.

In Claim 19, Column 12, Lines 26-27, delete "the concentration of n-type dopant" and insert therefor -- a concentration of the n-type dopant --.

In Claim 25, Column 12, Line 51, delete "the n-type dopant" and insert therefor -- an n-type dopant --.

In Claim 25, Column 12, Line 60, delete "the n-type" and insert therefor -- "the n-type dopant" --.

Signed and Sealed this
Second Day of May, 2023

Katherine Kelly Vidal
*Director of the United States Patent and Trademark Office*